(12) United States Patent
Hwang et al.

(10) Patent No.: US 9,245,947 B2
(45) Date of Patent: Jan. 26, 2016

(54) HIGH ELECTRON MOBILITY TRANSISTORS AND METHODS OF MANUFACTURING THE SAME

(75) Inventors: In-jun Hwang, Hwaseong-si (KR); Ki-ha Hong, Cheonan-si (KR); Jae-joon Oh, Seongnam-si (KR); Jong-bong Ha, Yongin-si (KR); Jong-seob Kim, Hwaseong-si (KR); Hyuk-soon Choi, Hwaseong-si (KR); Jai-kwang Shin, Anyang-si (KR)

(73) Assignee: Samsung Electronics Co., LTD., Gyeonggi-do (KR)

( * ) Notice: Subject to any disclaimer, the term of this patent is extended or adjusted under 35 U.S.C. 154(b) by 16 days.

(21) Appl. No.: 13/534,730

(22) Filed: Jun. 27, 2012

(65) Prior Publication Data

US 2013/0001587 A1    Jan. 3, 2013

(30) Foreign Application Priority Data

Jun. 28, 2011    (KR) .................. 10-2011-0063047

(51) Int. Cl.
| | |
|---|---|
| *H01L 29/778* | (2006.01) |
| *H01L 21/335* | (2006.01) |
| *H01L 29/06* | (2006.01) |
| *H01L 29/66* | (2006.01) |
| *H01L 21/306* | (2006.01) |
| *H01L 21/3065* | (2006.01) |
| *H01L 29/20* | (2006.01) |

(52) U.S. Cl.
CPC ...... *H01L 29/0657* (2013.01); *H01L 29/66462* (2013.01); *H01L 29/7782* (2013.01); *H01L 29/7787* (2013.01); *H01L 21/3065* (2013.01); *H01L 21/30604* (2013.01); *H01L 21/30608* (2013.01); *H01L 29/2003* (2013.01)

(58) Field of Classification Search
CPC ..... H01L 29/778; H01L 21/00; H01L 21/335; H01L 29/04; H01L 23/48; H01L 23/52
USPC .................. 257/192–200, E29.246, E29.247, 257/E29.248, E29.252, E21.403, E21.407, 257/77, E29.081, E29.108, 257/E29.068–E29.322, 615, 618, 276, 275, 257/280–284; 438/142–378
See application file for complete search history.

(56) References Cited

U.S. PATENT DOCUMENTS

| | | | | |
|---|---|---|---|---|
| 5,252,842 A | * | 10/1993 | Buck et al. ..................... | 257/280 |
| 5,468,343 A | * | 11/1995 | Kitano ........................... | 438/745 |
| 7,498,618 B2 | | 3/2009 | Saito et al. | |
| 2002/0030267 A1 | * | 3/2002 | Suzuki ........................... | 257/698 |
| 2009/0091011 A1 | * | 4/2009 | Das et al. ....................... | 257/675 |
| 2010/0012952 A1 | | 1/2010 | Saxler et al. | |
| 2010/0059791 A1 | * | 3/2010 | Takagi ........................... | 257/192 |
| 2010/0320505 A1 | * | 12/2010 | Okamoto et al. ............. | 257/192 |
| 2011/0057235 A1 | * | 3/2011 | Shim ............................. | 257/194 |
| 2012/0007143 A1 | * | 1/2012 | Kim et al. ..................... | 257/190 |

FOREIGN PATENT DOCUMENTS

| | | |
|---|---|---|
| JP | 2005217361 A | 8/2005 |
| JP | 2007273597 A | 10/2007 |
| JP | 2008159842 A | 7/2008 |

(Continued)

*Primary Examiner* — David Vu
*Assistant Examiner* — Mouloucoulaye Inoussa
(74) *Attorney, Agent, or Firm* — Harness, Dickey & Pierce P.L.C.

(57) ABSTRACT

High electron mobility transistors (HEMTs) including a cavity below a drain and methods of manufacturing HEMTS including removing a portion of a substrate below a drain.

18 Claims, 7 Drawing Sheets

(56) References Cited

FOREIGN PATENT DOCUMENTS

| | | |
|---|---|---|
| JP | 2008270310 A | 11/2008 |
| JP | 2009016655 A | 1/2009 |
| JP | 2010199409 A | 9/2010 |
| WO | WO 2010018976 A2 | 2/2010 |

\* cited by examiner

HIGH ELECTRON MOBILITY TRANSISTORS AND METHODS OF MANUFACTURING THE SAME

CROSS-REFERENCE TO RELATED APPLICATION

This application claims priority under 35 U.S.C. §119 to Korean Patent Application No. 10-2011-0063047, filed on Jun. 28, 2011, in the Korean Intellectual Property Office (KIPO), the entire contents of which is incorporated herein by reference.

BACKGROUND

1. Field

Example embodiments relate to semiconductor devices and methods of manufacturing the same, and more particularly, to high electron mobility transistors (HEMTs) and methods of manufacturing the same.

2. Description of the Related Art

Field effect semiconductor devices, for example, high electron mobility transistors (HEMTs), are electronic devices that may be used in high frequency bands. For example, HEMTs may be used in communication technologies operating at high frequencies.

A HEMT may include a hetero-junction structure including semiconductor material layers of different band gaps contacting each other. A semiconductor material layer with a relatively large band gap functions as a donor. A 2-dimensional electron gas (2DEG) may be induced in a semiconductor material layer with a relatively small band gap by the donor. Electrons may move faster within the 2-DEG of the junction than within planar semiconductor devices including a single semiconductor.

A HEMT is used to achieve increased mobility of electron carriers, and also as a power device, for example, a transistor with a high breakdown voltage. A HEMT includes a semiconductor with a wide band gap, for example, a compound semiconductor, and may break down at a relatively high breakdown voltage. Therefore, a HEMT may be used in high voltage applications.

Silicon, which is a common material widely used in a semiconductor device, has a relatively low electron mobility, and thus a high source resistance may occur. A group III-V compound semiconductor may be used in a HEMT instead of silicon. For example, a gallium nitride-based compound may be a material used in a HEMT due to a relatively wide band gap, high electron saturation velocity, and high chemical stability. HEMTs that use gallium nitride-based compounds may be high temperature, high power and high frequency electronic devices.

SUMMARY

Example embodiments may include high electron mobility transistors (HEMTs) in which a portion of a substrate below a drain is removed. Example embodiments may include methods of manufacturing HEMTs in which a portion of a substrate below a drain is removed.

According to example embodiments, a HEMT includes a substrate, a first semiconductor layer formed on the substrate, a second semiconductor layer formed on the first semiconductor layer, and sources, a drain, and gates formed on the second semiconductor layer. A cavity is formed in the substrate.

The cavity may be formed below the drain. Between the cavity and the drain, a hole may be formed in portions of the first semiconductor layer and the second semiconductor layer, and a diameter of the hole may be from 10 nm to 10 μm. The first semiconductor layer may include a group III-V semiconductor compound. The first semiconductor layer may include GaN, GaAs or InN. The second semiconductor layer may include AlGaN, AlN, AlGaAs, or AlInN. The HEMT may further include an insulation layer formed in the cavity. The HEMT may further include an etching stop region formed around the cavity.

According to other example embodiments, a method of manufacturing a HEMT includes stacking a first semiconductor layer and a second semiconductor layer on a substrate in the order stated, partially exposing the substrate by forming a hole in the second semiconductor layer and the first semiconductor layer, forming a cavity in the substrate by etching the substrate via the hole, and forming sources, a drain, and gates on the second semiconductor layer. The cavity may be formed by anisotropically or isotropically etching the substrate. An etchant used in the anisotropic etching operation may be NaOH, ethylenediamine pyrocatechol (EDP), potassium hydroxide (KOH), potassium hydroxide isopropyl alcohol (KOH-IPA), or tetra methyl ammonium hydroxide (TMAH). The isotropic etching operation may be a wet etching operation using (hydrofluoric, nitric, acetic) (HNA) or a dry etching operation using $XeF_2$. The method may further include forming an etching stop region by doping the substrate. The hole may be formed to have a linear shape or formed as a plurality of dots.

According to at least one example embodiment, a HEMT includes a substrate including a cavity, a first semiconductor layer on the substrate, a second semiconductor layer on the first semiconductor layer, and a plurality of sources, a drain, and a plurality of gates on the second semiconductor layer.

According to at least one example embodiment, a method of manufacturing a HEMT includes stacking a first semiconductor layer on a substrate, stacking a second semiconductor layer on the first semiconductor layer, exposing a portion of the substrate by forming a hole in the second semiconductor layer and the first semiconductor layer, forming a cavity in the substrate by etching the substrate via the hole, and forming a plurality of sources, a drain, and a plurality of gates on the second semiconductor layer.

According to at least one example embodiment, a HEMT includes a substrate including an insulation region, a first semiconductor layer on the substrate, a second semiconductor layer on the first semiconductor layer, and a source, drain and gate on the second semiconductor layer.

BRIEF DESCRIPTION OF THE DRAWINGS

Example embodiments will be more clearly understood from the following brief description taken in conjunction with the accompanying drawings. FIGS. 1-8B represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A substrate as used herein may include a bulk substrate, an epitaxial layer, and/or other support layers. Although example embodiments are described below according to a doping scheme, example embodiments may include different doping schemes. For example, the doping scheme may be reversed.

Figure 1:
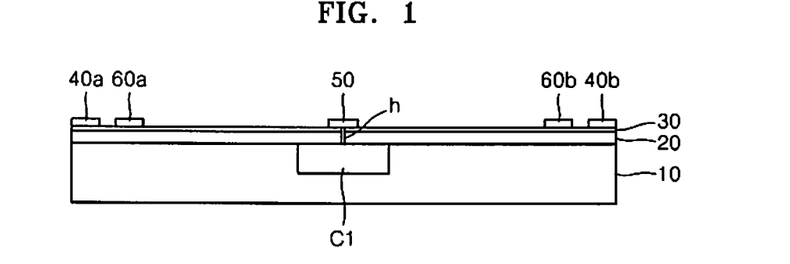
FIG. 1 is a cross-sectional diagram illustrating high electron mobility transistors (HEMTs) according to example embodiments.

FIG. 1 is a cross-sectional diagram illustrating high electron mobility transistors (HEMTs) according to example embodiments. Referring to FIG. 1, in a HEMT according to at least one example embodiment, a first semiconductor layer 20 may be on a substrate 10. A second semiconductor layer 30 may be on the first semiconductor layer 20. Sources 40a and 40b, a drain 50, and gates 60a and 60b may be on the second semiconductor layer 30. A cavity C1 may be in a portion of the substrate 10 below the drain 50. A hole h may be between the cavity C1 and the drain 50. A shape of the cavity C1 may be about straight-edged, for example, rectangular.

Figure 2:
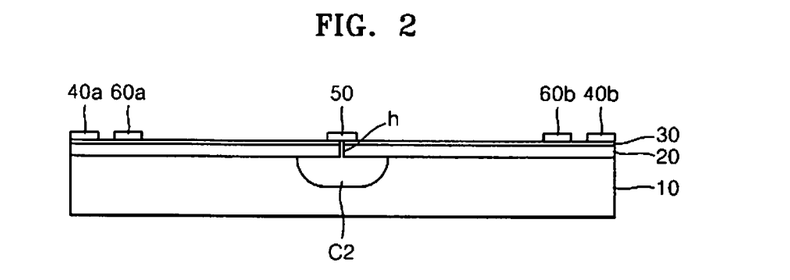
FIG. 2 is a cross-sectional diagram illustrating HEMTs according to other example embodiments.

FIG. 2 is a cross-sectional diagram illustrating HEMTs according to other example embodiments. Referring to FIG. 2, in a HEMT according to at least one example embodiment, a first semiconductor layer 20 may be on a substrate 10. A second semiconductor layer 30 may be on the first semiconductor layer 20. Sources 40a and 40b, a drain 50, and gates 60a and 60b may be on the second semiconductor layer 30. A cavity C2 may be in a portion of the substrate 10 below the drain 50. A hole h may be formed between the cavity C2 and the drain 50. A shape of the cavity C2 may be curved, for example, semicircular.

Referring to FIGS. 1 and 3, the shapes of the cavities C1 and C2 may vary based on whether the substrate 10 is etched anisotropically (e.g., using an anisotropic etch process) or isotropically (e.g., using an isotropic etch process). The shape of the cavity C1 shown in FIG. 1 may be rectangular and may be formed by anisotropically etching the substrate 10. The shape of the cavity C2 shown in FIG. 2 may be semicircular and may be formed by isotropically etching the substrate 10. In a HEMT, a high voltage may be applied between the sources 40a and 40b and the drain 50 during a high power operation. An electric field (e.g., a high electric field) may concentrate around the drain 50. If a breakdown voltage of the substrate 10 is low, the HEMT may be destroyed. In a HEMT according to at least one example embodiment, device destruction may be prevented by forming cavities C1 and C2 in portions of the substrate 10 below the drain 50.

The substrate 10 may be, for example, a silicon substrate. For example, the substrate 10 may be an n-type Si substrate (e.g., a silicon substrate doped with an n-type dopant). The substrate 10 may be grounded. The first semiconductor layer 20 and the second semiconductor layer 30 may include semiconductor materials with different band gap energies. For example, a band gap energy of the material of the first semiconductor layer 20 may be less than a band gap energy of a semiconductor material of the second semiconductor layer 30. The first semiconductor layer 20 may include a group III-V semiconductor compound, for example, GaN, GaAs and/or InN. The second semiconductor layer 30 may include AlGaN, AlN, AlGaAs, and/or AlInN.

The first semiconductor layer 20 and the second semiconductor layer 30 may be compound semiconductor layers with different lattice constants. A 2-dimensional electron gas (2DEG) may be induced between the first semiconductor layer 20 and second semiconductor layer 30 due to a heterojunction structure of the first semiconductor layer 20 and second semiconductor layer 30 (e.g., at the interface between the first and second semiconductor layers). The first semiconductor layer 20 may be a channel region and the second semiconductor layer 30 may be a channel supply layer.

The sources 40a and 40b, the drain 50, and the gates 60a and 60b may include conductive material, for example, metals, metal alloys, conductive metal oxides and/or conductive metal nitrides. The sources 40a and 40b, the drain 50, and the gates 60a and 60b may each include a single layer or a plurality of layers. A buffer layer (not shown) may be between the substrate 10 and the first semiconductor layer 20. The buffer layer may include a nitride. For example, the buffer layer may be AlN and/or AlGaN. A gate insulation layer (not shown) may be between the second semiconductor layer 30 and the gates 60a and 60b. Contact layers (not shown) may be between the sources 40a and 40b and the second semiconductor layer 30 and between the drain 50 and the second semiconductor layer 30.

Figure 3A:
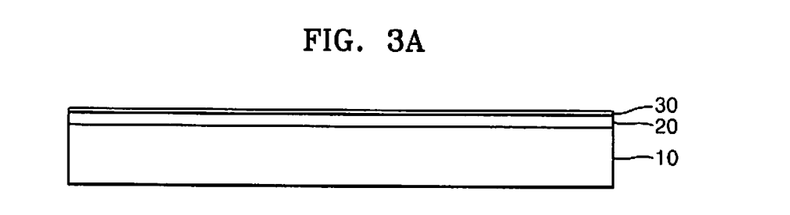
FIGS. 3A-3D are cross-sectional diagrams illustrating methods of manufacturing HEMTs according to further example embodiments.
Figure 3B:
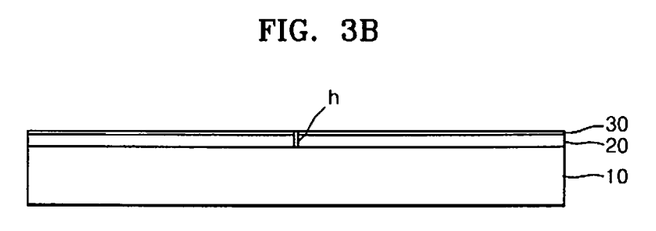
Figure 3C:
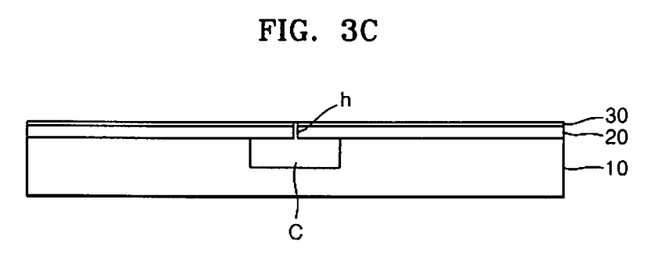

FIGS. 3A-3D are cross-sectional diagrams illustrating methods of manufacturing HEMTs according to further example embodiments. Referring to FIG. 3A, the first semiconductor layer 20 may be formed on the substrate 10. The second semiconductor layer 30 may be formed on the first semiconductor layer 20. The substrate 10 may be formed of, for example, silicon and/or n-doped Si. Referring to FIG. 3B, the substrate 10 may be partially exposed by forming a hole h in the first semiconductor layer 20 and the second semiconductor layer 30. A diameter of the hole h may be about 10 nm to about 10 μm. Referring to FIG. 3C, the cavity C may be formed in the substrate 10 by etching the substrate 10 through the hole h.

Figure 3D:
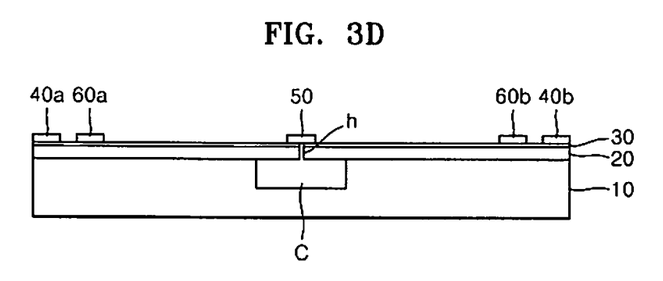

For example, the hole h may be used to inject therethrough an etchant to etch the substrate. There may not be limits to a diameter and depth of the cavity C, and the cavity C may be formed to have a larger width than that of the drain 50. The shape of the cavity C may vary according to the type of etching operation. For example, if the cavity C is formed via anisotropic etching, the cavity C (e.g., a cavity C1) may be rectangular shaped, as illustrated in FIG. 1, and may be cuboidal in shape when viewed in three dimensions (FIG. 1 is a cross-section of a three dimensional structure). According to at least one example embodiment, if the cavity C is formed via isotropic etching, the cavity C may be semicircular shaped (e.g., a cavity C2), as illustrated in FIG. 2, and may be hemispherically shaped when viewed in three dimensions. Referring to FIG. 3D, the sources 40a and 40b, the drain 50, and the gates 60a and 60b may be formed by depositing conductive materials on the second semiconductor layer 30 and patterning the same.

Figure 4A:
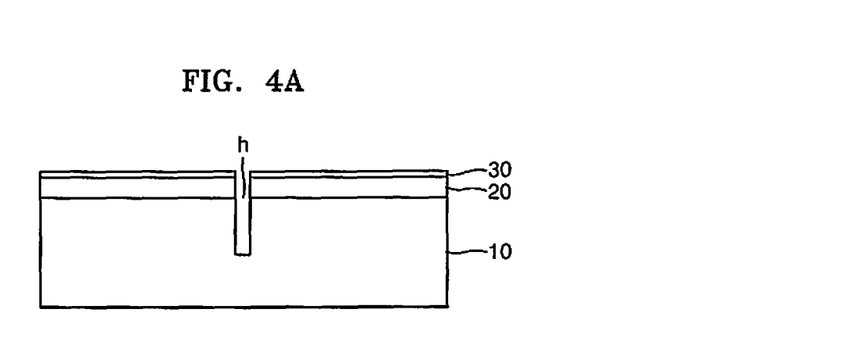
FIGS. 4A-4C are cross-sectional diagrams illustrating methods of manufacturing HEMT etched regions according to still other example embodiments.
Figure 4B:
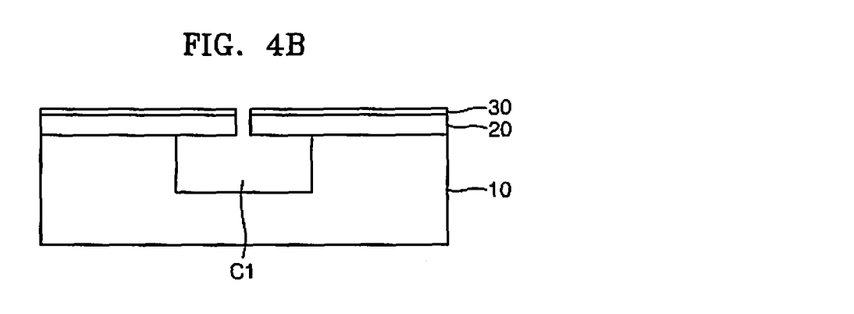
Figure 4C:
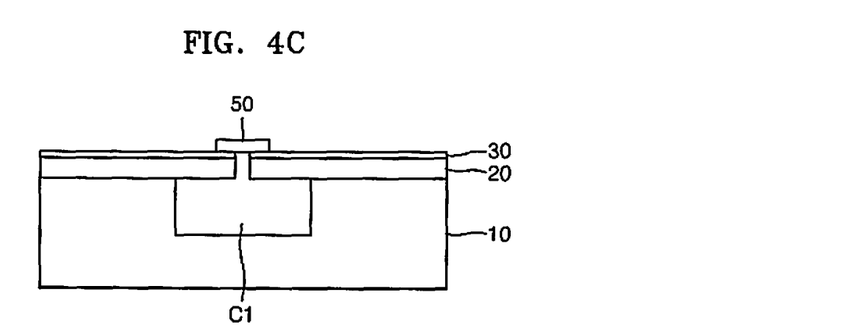
Figure 5A:
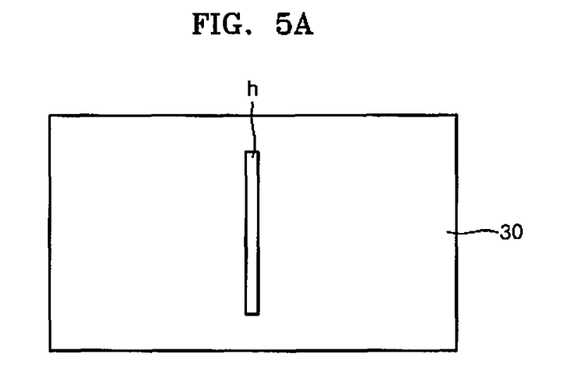
FIGS. 5A and 5B are plan diagrams illustrating some of the methods of manufacturing the etched regions of FIGS. 4A and 4B, respectively.
Figure 5B:
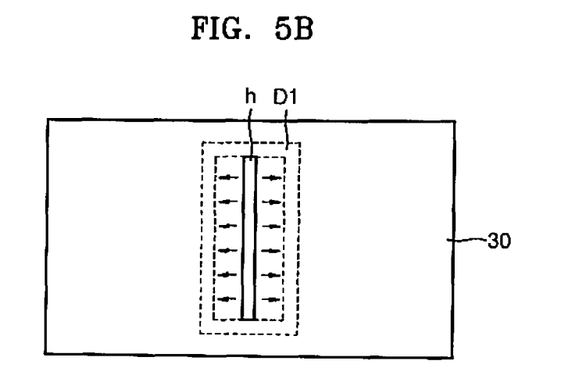

FIGS. 4A-4C are cross-sectional diagrams illustrating methods of manufacturing HEMT etched regions using an anisotropic etch according to still other example embodiments. FIGS. 5A and 5B are plan diagrams corresponding to FIGS. 4A and 4B, respectively. Referring to FIGS. 4A and 5A, a hole h is formed in the second semiconductor layer 30 and the first semiconductor layer 20. The substrate 10 may be etched to a desired depth. Because in an anisotropic etch features are etched with high directivity, the hole h may be formed in the second semiconductor layer 30 in a linear shape.

Referring to FIG. 4B, the substrate 10 may be etched by injecting an etchant via the hole h formed in the second semiconductor layer 30 and the first semiconductor layer 20. Due to the anisotropic etch, a shape of the cavity C1 may be a rectangular shape in a sectional view. In a case where the substrate 10 is silicon, an anistropic etchant may include NaOH, ethylenediamine pyrocatechol (EDP), potassium hydroxide (KOH), potassium hydroxide isopropyl alcohol (KOH-IPA), and/or tetra methyl ammonium hydroxide (TMAH). For example, KOH may feature strong etch directivity in a Si{110} direction. According to at least one embodiment (not shown) a particular region of the substrate 10 may be selectively etched in advance to define an etching region of the substrate 10.

Referring to FIG. 5B, a doped region D1 may be formed in the substrate 10. The doped region D1 may be a region of the substrate 10 doped with a p+ type material, for example, doped before the first semiconductor layer 20 is formed in operations for forming an HEMT according to at least one example embodiment. The doped region D1 may be an etch stop region. The doped region D1 may be formed around the cavity C1 of the substrate 10. Referring to FIGS. 4B and 5B, the cavity C1 may be defined by the doped region D1.

Referring to FIG. 4C, a drain 50 may be formed on the second semiconductor layer 30. An insulation layer (not shown) may be formed in the cavity C1 by injecting an insulation material through the hole h. For example, the insulation material may be injected before the drain 50 is formed. The insulation layer may include any of various insulation materials, for example, a Si oxide, a Si nitride, a Hf oxide, an Al oxide, a Ca oxide, a Cu oxide, a Zr oxide, a Zn oxide, a Ti oxide, a Ta oxide, a Ba oxide, a ZrSi oxide, a La oxide and/or the like. According to at least one example embodiment, the insulation layer may be in the cavity C1 and the hole h.

Figure 6A:
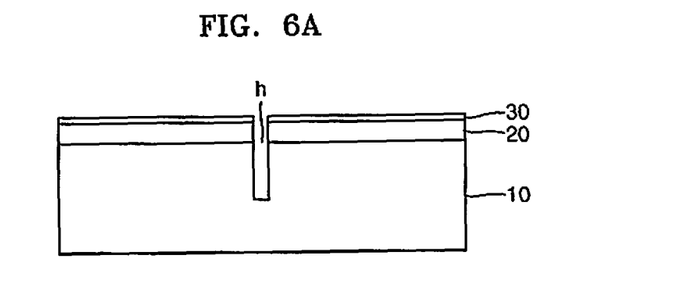
FIGS. 6A-6C are cross-sectional diagrams illustrating methods of manufacturing HEMT etched regions according to still further example embodiments.
Figure 6B:
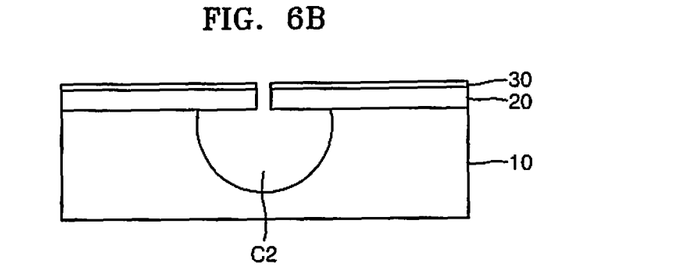
Figure 6C:
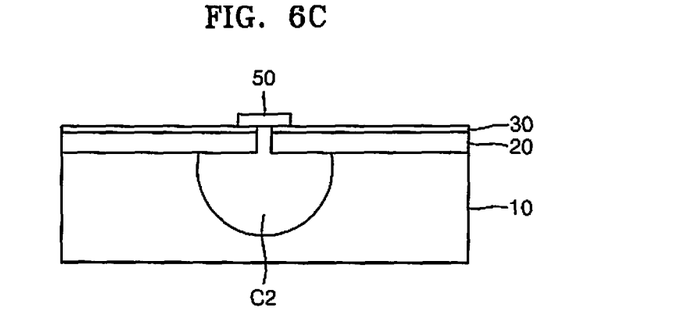
Figure 7A:
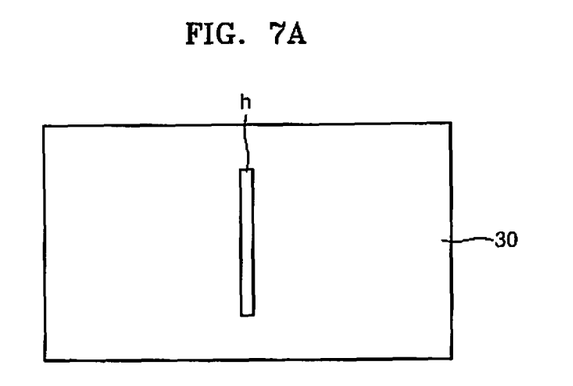
FIGS. 7A and 7B are plan diagrams illustrating some of the methods of manufacturing etched regions of FIGS. 6A and 6B, respectively.
Figure 7B:
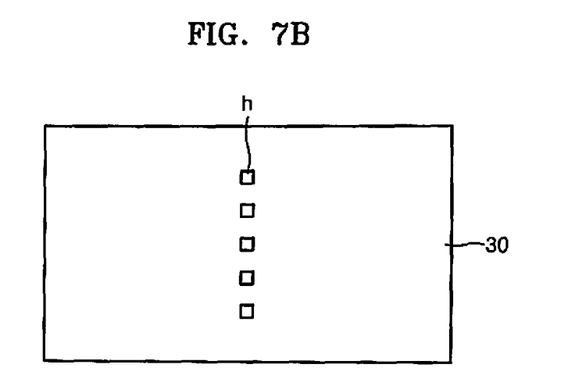
Figure 8A:
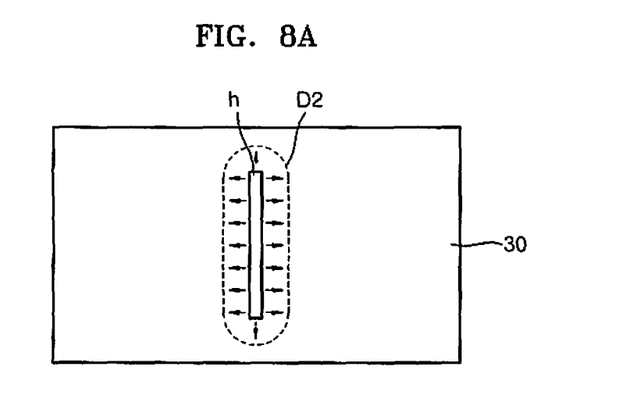
FIGS. 8A and 8B are plan diagrams illustrating some of the methods of manufacturing etched regions of FIGS. 7A and 7B, respectively.
Figure 8B:
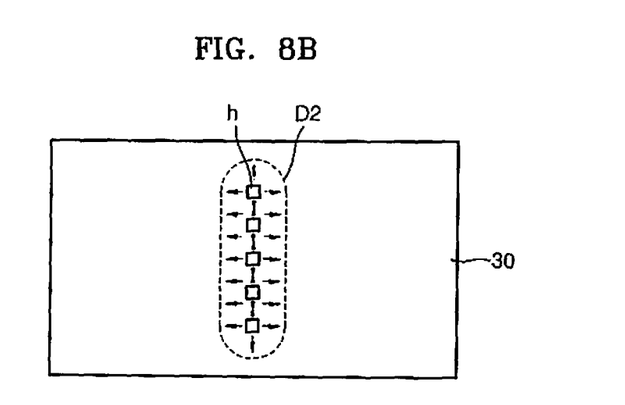

FIGS. 6A-6C are cross-sectional diagrams illustrating methods of manufacturing HEMT etched regions according to still further example embodiments. FIG. 7A may be a plan diagram of the operation illustrated in FIG. 6A in a case where a hole h is formed in a linear shape. FIG. 8A may illustrate a doping region used in at least one method of forming a linear hole h as illustrated in FIG. 7A. FIG. 7B may be a plan view of the operation illustrated in FIG. 6A in a case where the hole h is formed as a plurality of dots. FIG. 8B may illustrate a doping region used in at least one method of forming a hole h including a plurality of dots as illustrated in FIG. 7B.

Referring to FIGS. 6A and 7A, the substrate 10 may be partially exposed by forming a hole h in the second semiconductor layer 30 and first semiconductor layer 20. For improved etch efficiency, the substrate 10 may be etched to a depth in advance. For isotropic etching of the substrate 10, the hole h may be formed in any of various shapes. For example, the hole h may be formed in a linear shape, as shown in FIG. 7A, and/or the hole h may be formed as a plurality of dots, as shown in FIG. 7B. Referring to FIG. 6B, the cavity C2 may be formed by injecting an isotropic etchant through the hole h formed in the second semiconductor layer 30 and the first semiconductor layer 20. Due to the isotropic etch operation, the cavity C2 may be hemispherically shaped.

The substrate 10 may be dry etched and/or wet etched. In a case where the substrate 10 is formed of silicon, a fluorine-based material may be used for an isotropic etch operation. For example, the substrate 10 may be wet etched using (hydrofluoric, nitric, acetic) a mixture of hydrofluoric (HF), nitric ($HNO_3$) and acetic ($CH_3COOH$) acids) (HNA). According to an example embodiment, the substrate 10 may be dry etched using, for example, $XeF_2$. A particular region of the substrate 10 may be etched in advance to define an etch region of the substrate 10.

Referring to FIG. 8A, a doped region D2 may be formed in the substrate 10, for example, in advance. In operations for manufacturing an HEMT according to at least one example embodiment, an etch region may be defined by forming an etch stop region. The etch stop region may be a doping a region of the substrate 10, for example, before the first semiconductor layer 20 is formed. An etch stop region may be formed around the cavity C1 of the substrate 10. FIG. 8B may illustrate a doped region D2 where the hole h is a plurality of dots.

Referring to FIG. 6C, the drain 50 may be formed on the second semiconductor layer 30 (e.g., after the cavity C2 is formed in the substrate 10). An insulation layer (not shown) may be formed in the cavity C2 by injecting an insulation material through the hole h, for example, before the drain 50 is formed.

According to example embodiments, device destruction may be prevented by increasing a breakdown voltage of a HEMT by forming a cavity. The cavity may be formed by removing (e.g., etching) a portion of a substrate below a semiconductor layer that may correspond to a drain.

While example embodiments have been particularly shown and described, it will be understood by one of ordinary skill in the art that variations in form and detail may be made therein without departing from the spirit and scope of the claims.

What is claimed is:

1. A high electron mobility transistor (HEMT), comprising:
    a substrate including a cavity;
    a first semiconductor layer on the substrate;
    a second semiconductor layer on the first semiconductor layer;
    a plurality of sources, a drain, and a plurality of gates on the second semiconductor layer; and
    an etch stop region around the cavity of the substrate,
    wherein the etch stop region is a doped region;
    wherein a hole penetrates the first semiconductor layer and the second semiconductor layer between the cavity and the drain, the hole being an unfilled region connecting the cavity and the drain; and
    wherein a diameter of the hole is about 10 nm to about 10 μm.

2. The HEMT of claim 1, wherein the cavity is below the drain.

3. A high electron mobility transistor (HEMT), comprising:
    a substrate including a cavity;
    a first semiconductor layer on the substrate;
    a second semiconductor layer on the first semiconductor layer; and
    a plurality of sources, a drain, and a plurality of gates on the second semiconductor layer;
    wherein a hole penetrates the first semiconductor layer and the second semiconductor layer between the cavity and the drain;
    wherein the hole is an unfilled region connecting the cavity and the drain; and
    wherein a diameter of the hole is about 10 nm to about 10 μm.

4. The HEMT of claim 1, wherein the first semiconductor layer includes a group III-V compound semiconductor.

5. The HEMT of claim 4, wherein the first semiconductor layer includes one of GaN, GaAs, and InN.

6. The HEMT of claim 1, wherein the second semiconductor layer includes one of AlGaN, AlN, AlGaAs, and AlInN.

7. The HEMT of claim 1, further comprising:
    an insulation layer on the substrate in the cavity.

8. The HEMT of claim 1, further comprising:
    an etch stop region in the substrate around the cavity.

9. A method of manufacturing a high electron mobility transistor (HEMT), the method comprising:
    forming an etch stop region in a substrate;
    stacking a first semiconductor layer on the substrate;
    stacking a second semiconductor layer on the first semiconductor layer;
    exposing the substrate by forming a hole in the second semiconductor layer and the first semiconductor layer;
    forming a cavity in the substrate by etching the substrate via the hole, the cavity defined by the etch stop region; and
    forming a plurality of sources, a drain, and a plurality of gates on the second semiconductor layer;
    wherein the etch stop region is a doped region;
    wherein the hole penetrates the first semiconductor layer and the second semiconductor layer between the cavity and the drain, the hole being an unfilled region connecting the cavity and the drain; and wherein a diameter of the hole is about 10 nm to about 10 µm.

10. The method of claim 9, wherein the forming a cavity includes anisotropically etching the substrate.

11. The method of claim 10, wherein the forming a cavity includes anisotropically etching the substrate with an etchant including at least one of NaOH, ethylenediamine pyrocatechol (EDP), potassium hydroxide (KOH), potassium hydroxide isopropyl alcohol (KOH-IPA), and tetra methyl ammonium hydroxide (TMAH).

12. The method of claim 9, wherein the forming a cavity includes isotropically etching the substrate.

13. The method of claim 12, wherein the forming a cavity includes isotropically etching the substrate by at least one of wet etching the substrate using at least one of (hydrofluoric, nitric, acetic) (HNA) and dry etching the substrate using $XeF_2$.

14. The method of claim 10, further comprising:
forming the etch stop region by doping the substrate.

15. The method of claim 10, wherein the exposing the substrate by forming a hole includes one of forming the hole in a linear shape and forming the hole as a plurality of dots.

16. A high mobility transistor (HEMT), comprising:
a substrate including an insulation region;
a first semiconductor layer on the substrate;
a second semiconductor layer on the first semiconductor layer;
a source, drain and gate on the second semiconductor layer; and
an etch stop region around the insulation region of the substrate,
wherein the etch stop region is a doped region;
wherein the insulation region penetrates the first semiconductor layer and the second semiconductor layer, the insulation region being an unfilled cavity connecting the cavity and the drain; and
wherein a diameter of the insulation region is about 10 nm to about 10 µm.

17. The HEMT of claim 16, wherein
the source is on at least two opposite sides of the drain,
the gate is between the source and drain at each of the opposite sides, and
the insulation region overlaps each side of the drain.

18. The HEMT of claim 17, wherein the insulation region does not overlap any side of the gate.

* * * * *